(12) United States Patent
Zhou et al.

(10) Patent No.: US 8,921,155 B2
(45) Date of Patent: Dec. 30, 2014

(54) RESISTIVE RANDOM ACCESS MEMORY (RAM) CELL AND METHOD FOR FORMING

(75) Inventors: Feng Zhou, Austin, TX (US); Ko-Min Chang, Austin, TX (US); Cheong Min Hong, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 269 days.

(21) Appl. No.: 13/085,217

(22) Filed: Apr. 12, 2011

(65) Prior Publication Data

US 2012/0261636 A1    Oct. 18, 2012

(51) Int. Cl.
  *H01L 21/027* (2006.01)
  *H01L 45/00* (2006.01)

(52) U.S. Cl.
  CPC ............ *H01L 45/08* (2013.01); *H01L 45/1233* (2013.01); *H01L 45/1675* (2013.01); *H01L 45/146* (2013.01); *H01L 45/1633* (2013.01)
  USPC .................................. 438/104; 257/E21.006

(58) Field of Classification Search
  CPC ........... H01L 2224/13147; H01L 2924/01029; H01L 2224/05647; H01L 2224/13647; H01L 2224/45147; H01L 2224/13611; H01L 2924/01073; H01L 2924/01022; H01L 45/1641; H01L 27/115; H01L 45/1675
  USPC .......... 257/4, E45.003, E21.006, 43; 438/104
  See application file for complete search history.

(56) References Cited

U.S. PATENT DOCUMENTS

| 6,162,737 | A | 12/2000 | Weimer et al. | |
| 6,489,247 | B1 | 12/2002 | Ye et al. | |
| 6,545,339 | B2 * | 4/2003 | Cabral et al. | 257/532 |
| 2001/0034129 | A1 * | 10/2001 | Moore et al. | 438/689 |
| 2009/0026433 | A1 * | 1/2009 | Chiang | 257/2 |
| 2010/0059730 | A1 * | 3/2010 | Ito et al. | 257/2 |
| 2010/0083487 | A1 | 4/2010 | Noshiro et al. | |
| 2010/0208503 | A1 * | 8/2010 | Kuo | 365/51 |
| 2011/0001110 | A1 * | 1/2011 | Takahashi | 257/2 |
| 2012/0015506 | A1 * | 1/2012 | Jo et al. | 438/482 |

FOREIGN PATENT DOCUMENTS

EP    2099070 A1    9/2009

OTHER PUBLICATIONS

Baek et al.; "Highly Scalable Non-Volatile Resistive Memory using Simple Binary Oxide Driven by Asymmetric Unipolar Voltage Pulses"; IEDM; 2004; pp. 23.6.1-23.6.4; IEEE.

Chen et al.; "Highly Scalable Hafnium Oxide Memory with Improvements of Resistive Distribution and Read Disturb Immunity"; IEDM; 2009; pp. 5.5.1-5.5.4; IEEE.

Ho et al.; "A Highly Reliable Self-Aligned Graded Oxide Wox Resistance Memory: Conduction Mechanisms and Reliability"; Symposium on VLSI Technology Digest of Technical Papers; 2007; pp. 228-229; IEEE.

Ye et al.; "Development of Cu Etch Process for Advanced Cu Interconnects"; IITC; 1998; 3 pgs; IEEE.

(Continued)

*Primary Examiner* — Wael Fahmy
*Assistant Examiner* — Sarah Salerno
(74) *Attorney, Agent, or Firm* — Joanna G. Chiu; James L. Clingan, Jr.

(57) ABSTRACT

A resistive random access memory cell uses a substrate and includes a gate stack over the substrate. The gate stack includes a first copper layer over the substrate, a copper oxide layer over the first copper layer, and a second copper layer over the copper oxide layer.

7 Claims, 6 Drawing Sheets

(56) References Cited

OTHER PUBLICATIONS

Tsunoda et al.; "Low Power and High Speed Switching of Ti-doped NiO ReRAM under the Unipolar Voltage Source of less than 3V"; Electron Devices Meeting; 2007; pp. 767-770.; IEEE.

Yoon et al.; "Vertical Cross-point Resistance Change Memory for Ultra-High-Density Non-Volatile Memory Applications"; Symposium on VLSI Technology Digest of Technical Papers; 2009; pp. 26-27; IEEE.

Wang et al.; "A Novel CuxSiyO Resistive Memory in Logic Technology with Excellent Data Retention and Resistance Distribution for Embedded Applications"; Symposium on VLSI Technology Digest of Technical Papers; 2010; pp. 89-90; IEEE.

Office Action mailed Jan. 16, 2013 in U.S. Appl. No. 13/085,208.

\* cited by examiner

RESISTIVE RANDOM ACCESS MEMORY (RAM) CELL AND METHOD FOR FORMING

CROSS-REFERENCE TO RELATED APPLICATION(S)

This application is related to U.S. patent application Ser. No. 13/085,208, filed on even date, entitled "RESISTIVE RANDOM ACCESS MEMORY (RAM) CELL AND METHOD FOR FORMING," naming Feng Zhou, Ko-Min Chang, and Cheong Min Hong as inventors, and assigned to the current assignee hereof.

BACKGROUND

1. Field

This disclosure relates generally to semiconductor processing, and more specifically, to a resistive random access memory (RAM) cell and a method for forming.

2. Related Art

Different types of devices may be used to implement non-volatile memories. For example, one type of non-volatile memory device is a charge storage metal-on-silicon (MOS) device in which the state of the device is based on the charge storage. These types of charge storage devices may store charge in an isolated floating gate, in dielectrics, or in discrete storage devices such as nanocrystals. Another type of non-volatile memory device is a polarity change device, such as a ferroelectric random access memory (FeRAM) device or a magnetoresistive random access memory (MRAM) device, in which the state of the device is based on a polarity of the device. Yet another type of non-volatile memory device is a conductivity change device, such as a phase change random access memory (PCRAM) device, a resistive random access memory (ReRAM) device, or a fuse and anti-fuse device, in which the state of the device is based on the conductivity of the device.

With respect to a resistive RAM (ReRAM) device, the states of the resistive RAM device depend on the resistance of the device. For example, a higher resistance may correspond to a first state and a lower resistance may correspond to a second state. Tight resistance distribution is necessary to achieve multilevel storage capability which can significantly increase the data density. Therefore, it is desirable to improve control over the resistance distribution and to improve data retention for resistive RAM devices.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one embodiment, a memory stack of a resistive RAM cell includes copper oxide as a conductive medium between two electrodes. Also, in one embodiment, a layer of copper is included between a bottom electrode and the copper oxide. In this embodiment, the copper oxide may be formed by oxidizing a surface of the underlying copper. The copper operates as a good oxygen absorber and allows for improved uniformity of the resulting copper oxide. Also, in one embodiment, a sidewall spacer may be used as adjacent sidewalls of the memory stack of a resistive RAM cell to prevent copper and oxygen diffusion into the surrounding interlayer dielectric. Furthermore, in an alternate embodiment, any transition metal oxide may be used as the conductive medium between the two electrodes, in which a sidewall spacer is formed adjacent the sidewalls of the memory stack of the resistive RAM in order to improve isolation. In one embodiment, the spacer may also prevent the movement of oxygen vacancies from the metal oxide, regardless of which oxide is used as the conductive material. The use of copper oxide and/or the sidewall spacer may result in a tighter resistance distribution and improved data retention.

Figure 1:
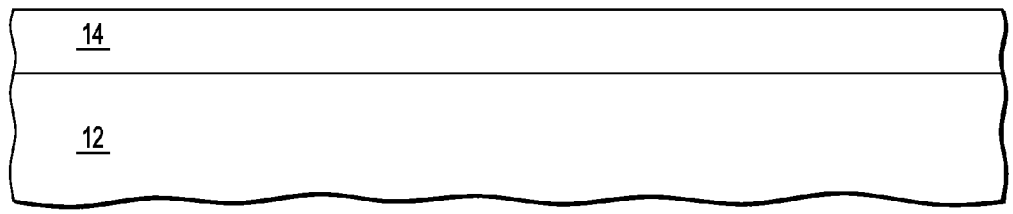
FIG. 1 illustrates a cross-sectional view of a semiconductor device at a first stage in processing, in accordance with an embodiment of the present invention.

FIG. 1 illustrates a semiconductor device 10 at a first stage in processing. Semiconductor device 10 includes a substrate 12, which can be any semiconductor or non-semiconductor material or combinations of material, such as gallium arsenide, silicon germanium, silicon-on-insulator (SOI), silicon, monocrystalline silicon, glass, plastic, the like, and combinations of the above. A conductive electrode layer 14 is formed over substrate 10. In one embodiment, conductive electrode layer 14 may include, for example, a transitional metal nitride, such as tantalum nitride or titanium nitride.

Figure 2:
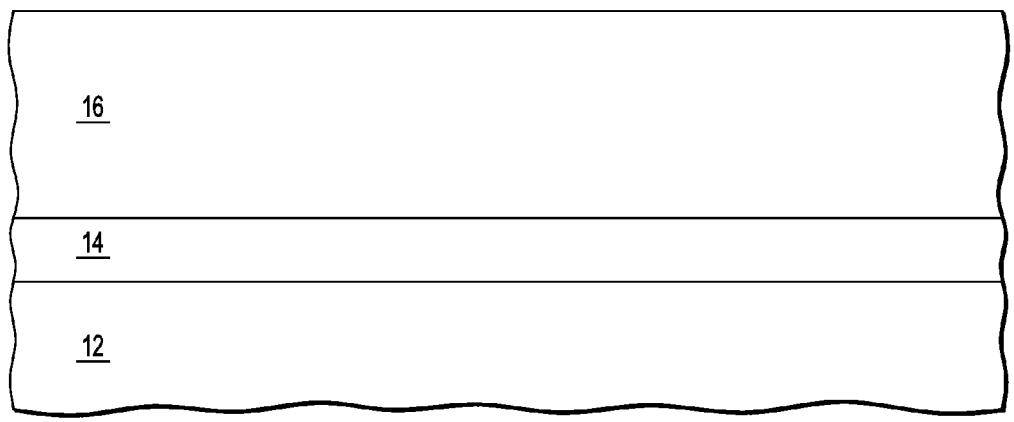
FIG. 2 illustrates a cross-sectional view of the semiconductor device of FIG. 1 at a subsequent stage in processing, in accordance with an embodiment of the present invention.

FIG. 2 illustrates semiconductor device 10 at a subsequent stage in processing. A copper layer 16 is formed over electrode layer 14. In one embodiment, copper layer 16 may be formed by deposition and has a thickness in a range of approximately 3000 to 6000 Angstroms.

Figure 3:
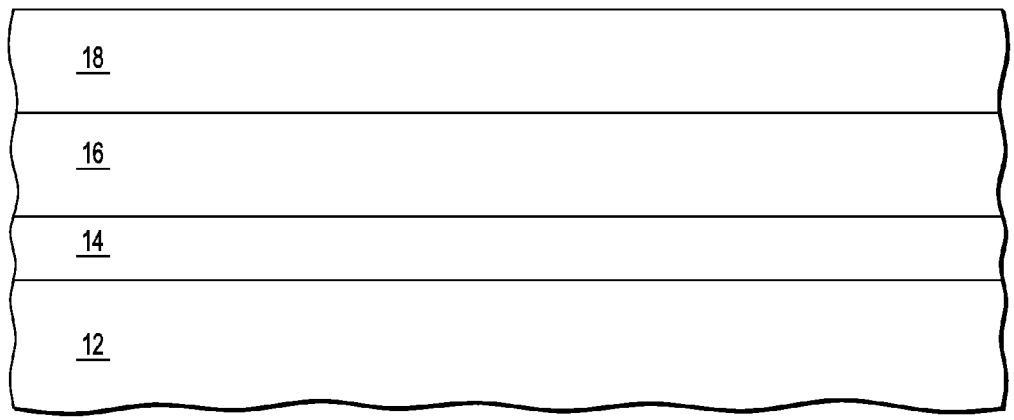
FIG. 3 illustrates a cross-sectional view of the semiconductor device of FIG. 2 at a subsequent stage in processing, in accordance with an embodiment of the present invention.

FIG. 3 illustrates semiconductor device 10 at a subsequent stage in processing in which a copper oxide layer 18 is grown directly on copper layer 16. In one embodiment, a top portion of copper layer 16 is oxidized to form a copper oxide layer 18 on copper layer 16. During the oxidizing of copper layer 16, the top portion of copper layer 16 is consumed, reducing the thickness of copper layer 16. In one embodiment, after oxidation, copper layer 16 has a thickness in a range of approximately 1500 to 3000 Angstroms. Also, copper oxide layer 18 may have a thickness of at least 1000 Angstroms, and in one embodiment, has a thickness in a range of approximately 1000 to 3000 Angstroms, or, more preferably, 1500 to 3000 Angstroms. By oxidizing copper layer 16 to form copper oxide layer 18, copper oxide layer 18 is formed directly on a bottom electrode formed by conductive electrode layer 14 and copper layer 16.

Figure 4:
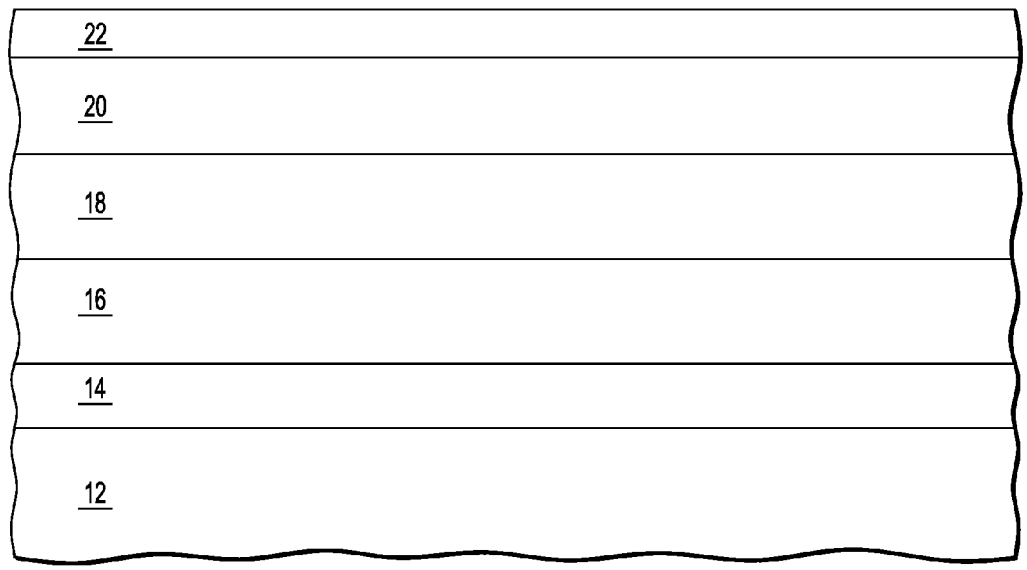
FIG. 4 illustrates a cross-sectional view of the semiconductor device of FIG. 3 at a subsequent stage in processing, in accordance with an embodiment of the present invention.

FIG. 4 illustrates semiconductor device 10 at a subsequent stage in processing. A copper layer 20 is formed over copper oxide layer 18 such as by deposition, and a conductive electrode layer 22 is formed over copper layer 20. In one embodiment, conductive electrode layer 22 may be the same material as conductive electrode 14 and may include, for example, a transitional metal nitride, such as tantalum nitride or titanium nitride. Note that copper layers 16 and 20 may also be referred to as metal layers 16 and 20.

Figure 5:
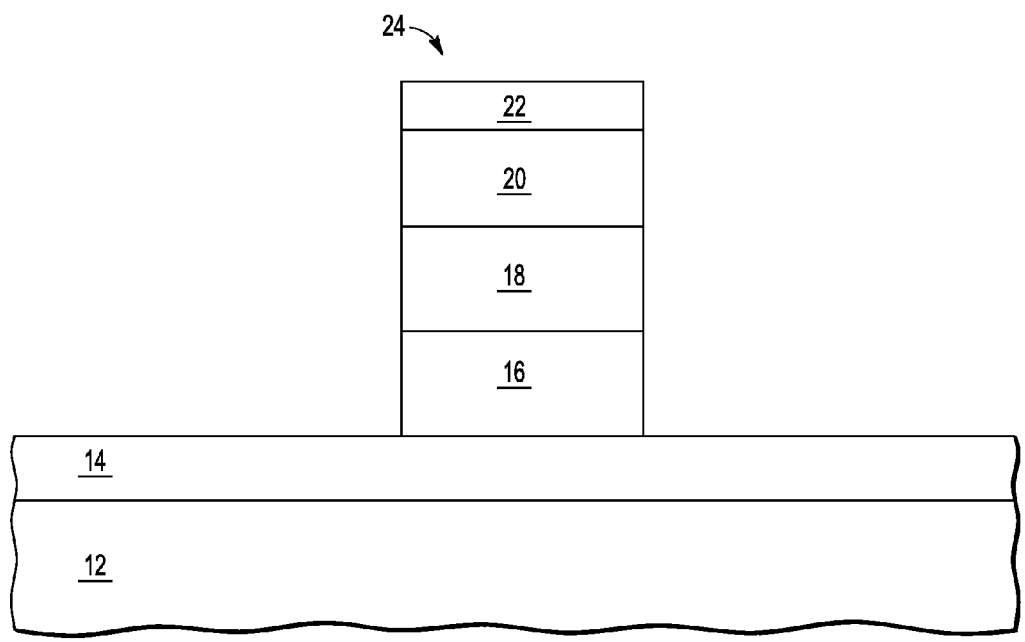
FIG. 5 illustrates a cross-sectional view of the semiconductor device of FIG. 4 at a subsequent stage in processing, in accordance with an embodiment of the present invention.

FIG. 5 illustrates semiconductor device 10 at a subsequent stage in processing. A patterned etch is performed of layers 22, 20, 18, and 16 to form a memory stack 24 (also referred to as a memory stack structure). Note that layer 14 under copper layer 16 may also be considered as part of memory stack 24 but may be patterned at a later stage in processing, as will be described below. In one embodiment, memory stack 24 illustrated in FIG. 5 can be etched with a reactive ion etching (RIE) process. In one embodiment, the RIE process may be performed with hydrogen chloride (HCl) and/or hydrogen bromide (HBr) as the sole or principal source of reactive species and at least 40% of all reactive species. For example, the reactive species may include 100 sccm HCl, 25 sccm $N_2$, and 5 sccm $BCl_3$. For the etch, the temperature of substrate 12 may be in a range of 150 and 350 degrees Celsius, the pressure may be between 5 and 40 mT, the source power to plasma coil may be 200 to 2500 W at 2 MHz, and the bias power to substrate support plate may be 50 to 800 W at 13.56 MHz.

Figure 6:
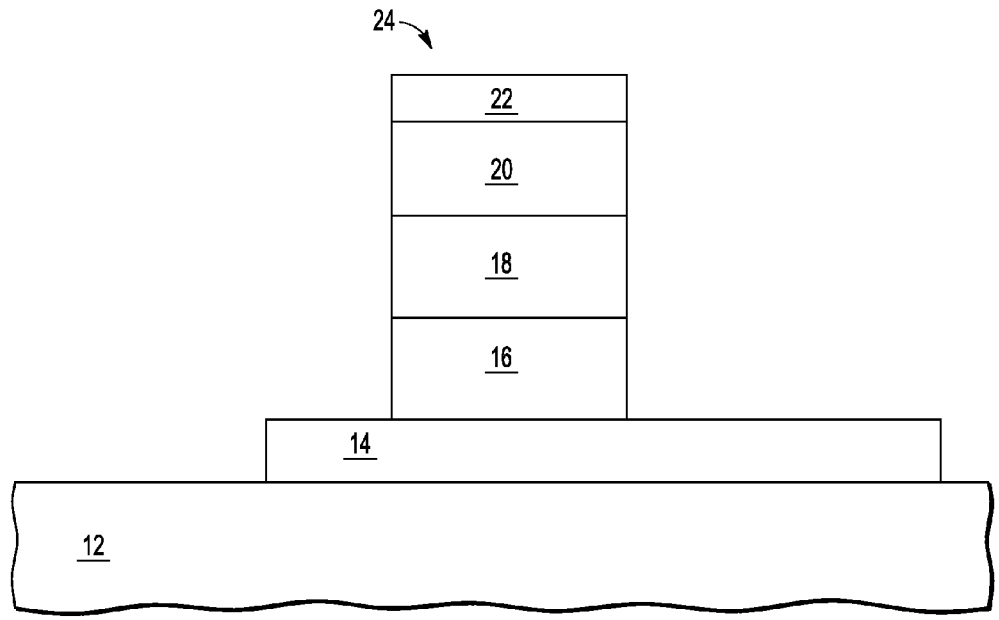
FIG. 6 illustrates a cross-sectional view of the semiconductor device of FIG. 5 at a subsequent stage in processing, in accordance with an embodiment of the present invention.

FIG. 6 illustrates semiconductor device 10 at a subsequent stage in processing in which a patterned etch of conductive electrode layer 14 may be performed to define two sidewalls of conductive electrode layer 14 on opposite sides of memory stack 24. Conductive layer 14 extends away from the sidewalls of memory stack 24 to allow space for the subsequent formation of a spacer and for subsequent contact formation, as will be seen below.

Figure 7:
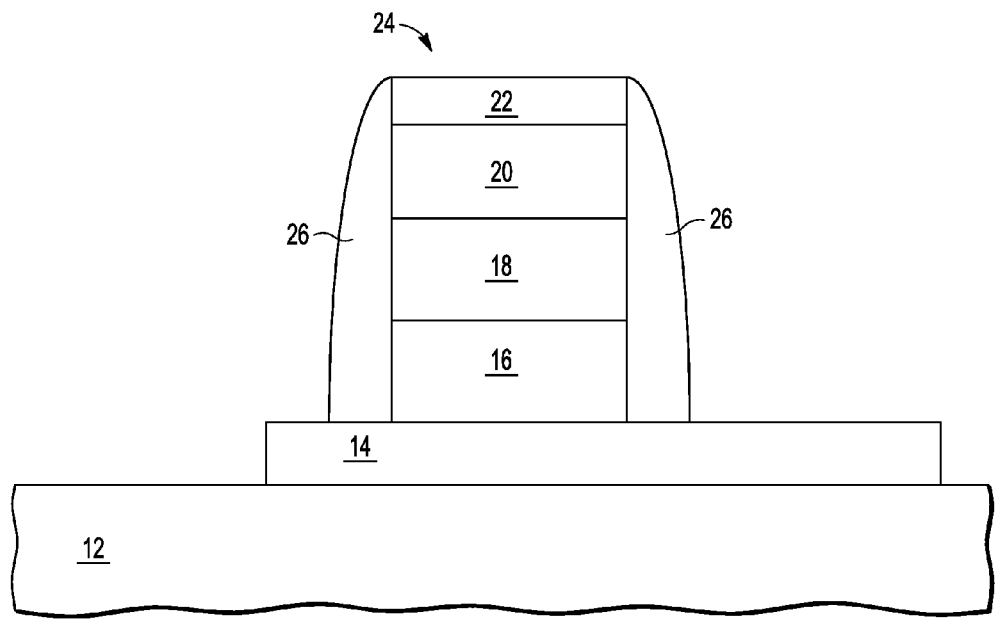
FIG. 7 illustrates a cross-sectional view of the semiconductor device of FIG. 6 at a subsequent stage in processing, in accordance with an embodiment of the present invention.

FIG. 7 illustrates semiconductor device 10 at a subsequent stage in processing. A sidewall spacer 26 is formed over conductive electrode layer 14, adjacent sidewalls of memory stack 24. For example, each of copper layer 16, copper oxide layer 18, copper layer 20, and conductive electrode layer 22 has a sidewall and spacer 26 is formed such that it is in contact with each of these sidewalls. In one embodiment, spacer 26 may be formed by depositing a conformal layer and performing an anisotropic etch back of the conformal layer. In one embodiment, spacer 26 is a nitride spacer. In one embodiment, spacer 26 has a composition which includes silicon, carbon, and nitrogen.

Figure 8:
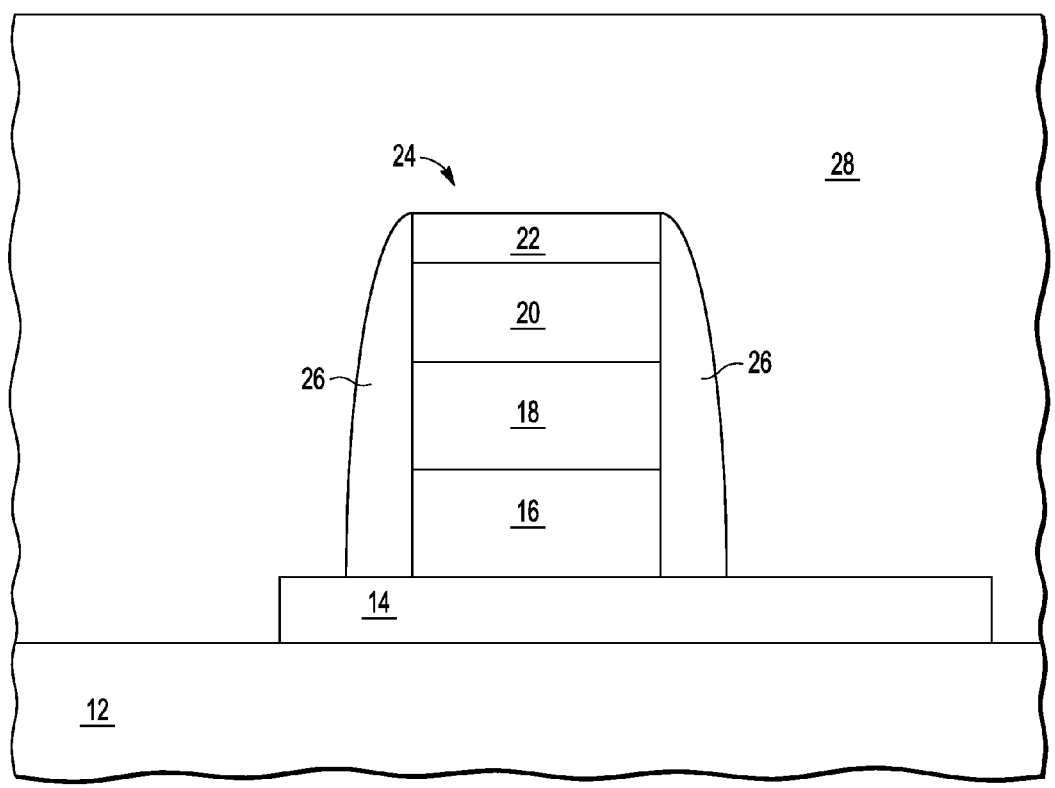
FIG. 8 illustrates a cross-sectional view of the semiconductor device of FIG. 7 at a subsequent stage in processing, in accordance with an embodiment of the present invention.

FIG. 8 illustrates semiconductor device 10 at a subsequent stage in processing in which an interlayer dielectric (ILD) layer 28 is formed over and around memory stack 24, and over spacer 26, conductive electrode layer 14, and substrate 12.

Figure 9:
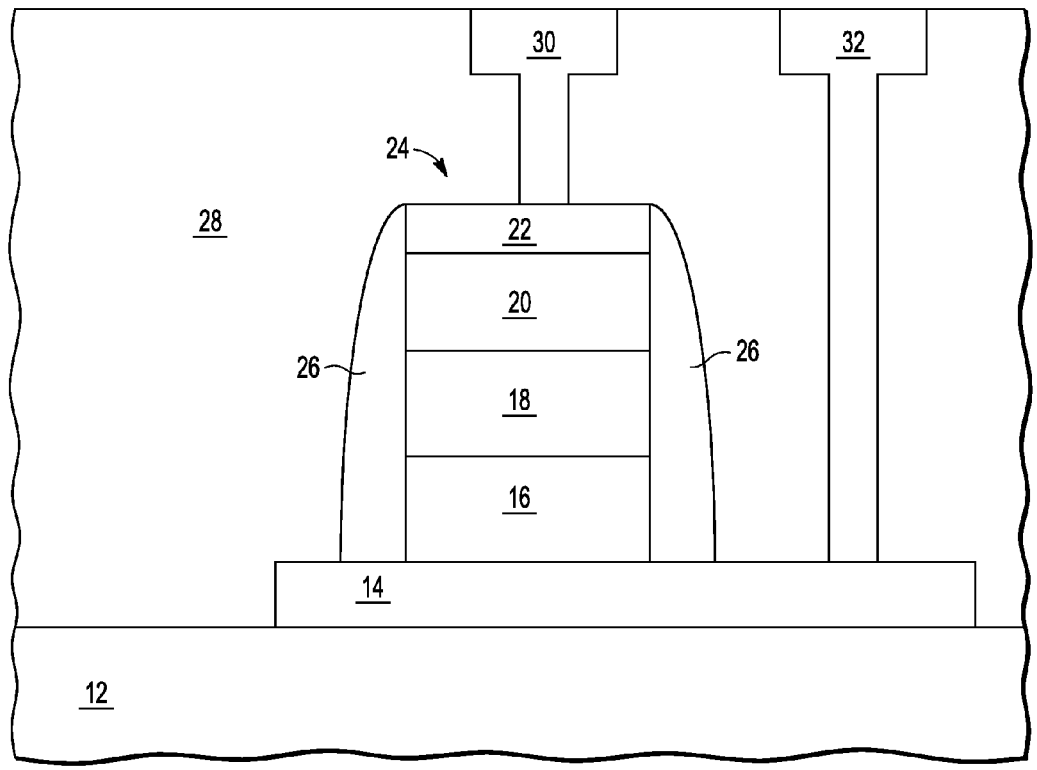
FIG. 9 illustrates a cross-sectional view of the semiconductor device of FIG. 8 at a subsequent stage in processing, in accordance with an embodiment of the present invention.

FIG. 9 illustrates semiconductor device 10 at a subsequent stage in processing in which contacts 30 and 32 are formed in ILD layer 28. Contact 30 provides a contact to a first electrode (e.g. conductive electrode 22) of memory stack 24 and contact 32 provides a contact to a second electrode (e.g. conductive electrode 14) of memory stack 24. In one embodiment, contacts 30 and 32 are formed by forming vias through ILD layer 28 (which may include a wider opening at a top portion of the via) down to electrode layer 22 and electrode layer 14, respectively. These vias can then be filled by a conductive material to form contacts 30 and 32.

Figure 10:
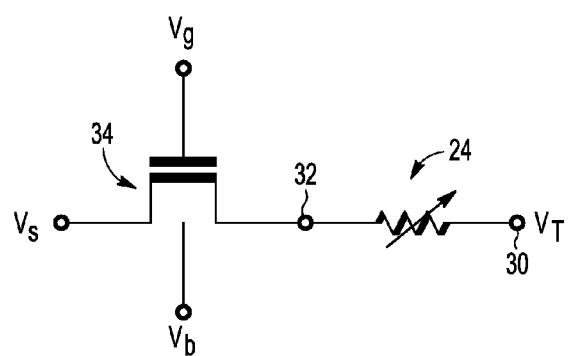
FIG. 10 illustrates, in schematic form, a resistive RAM cell coupled to a control transistor, in accordance with an embodiment of the present invention.

FIG. 10 illustrates, in schematic form, a transistor 34 coupled to memory stack 24. Note that memory stack 24 may also be referred to as memory cell 24. Transistor 34 comprises a gate node, a source node, a body node, and a drain node, in which the drain node is connected to contact 32 of memory cell 24. A threshold voltage, Vt, is applied to contact 30 of memory stack 24. The voltages applied to the nodes of transistor 34 (Vg to the gate node, Vs to the source node, and Vb to the body node) can be set to various values for controlling programming and operation of memory cell 24.

Figure 11:
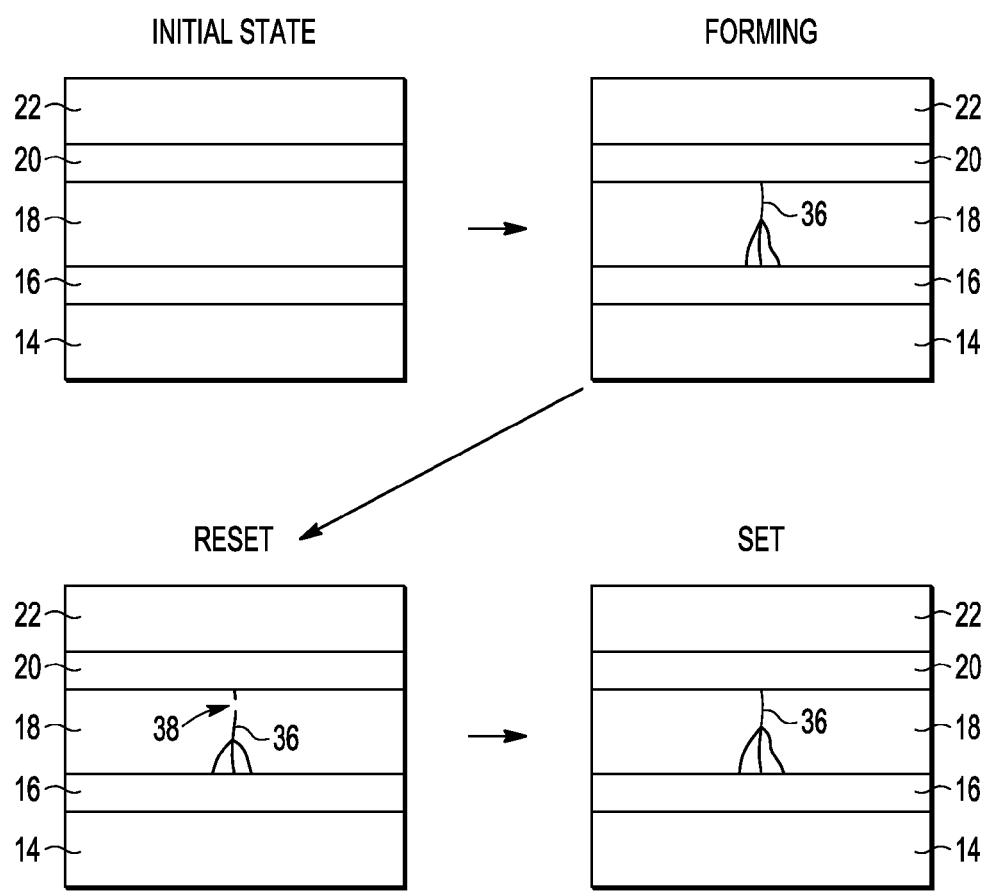
FIG. 11 illustrates, in diagrammatic form, an initial state, a forming process, a reset process, and a set process of a resistive RAM cell in accordance with an embodiment of the present invention.

FIG. 11 illustrates, in diagrammatic form, an initial state, a forming process, a reset process, and a set process of a resistive RAM cell, such as memory cell 24, in accordance with an embodiment of the present invention. Copper oxide layer 18 forms the conductive medium of memory cell 24, located between electrode layers 14 and 22. During the initial state, no filaments are present in copper oxide layer 18. During the forming process, filaments 36 are initially formed within copper oxide layer 18. This forming of filaments 36 is typically performed only once for memory cell 24. That is, the forming process is formed on fresh devices that have not yet been operated. Once the forming process is completed, a memory cell will not need the forming process again. For the forming process, voltages are applied to the nodes of transistor 34 resulting in a current through memory cell 24. This current forms filaments 36 which are formed of mobile ions or oxygen vacancies within the copper oxide layer. These filaments reduce the resistance of copper oxide 18. Once filaments 36 are formed, memory cell 24 can be set and reset as needed to change the state of the memory cell. During the reset process, voltages are applied to the nodes of transistor 34 resulting in a current which causes one or more ruptures in filaments 36. This causes the resistance of copper oxide 18 to increase, in which the increased resistance may correspond to a first state of memory cell 24. During the set process, voltages are applied to the nodes of transistor 34 resulting in a current which recovers filaments 36 by restoring continuity to the ruptures created during the reset. The recovery of filaments 36 causes the resistance of copper oxide 18 to decrease, in which the decreased resistance may correspond to a second state of memory cell 24.

Note that by growing copper oxide layer 18 directly on copper layer 16, an improved interface between the two layers is provided in which reduced defects are present as compared to interfaces formed by the deposition of layers. Also, since copper is a good oxygen absorber, copper layers 16 and 20 absorb random atomic or dangling oxygen, resulting in copper oxide layer 18 being more uniform. This increased uniformity resulting from the absorption of oxygen may allow, for example, for a tighter resistance distribution. That is, since dangling oxygen is absorbed from the interfaces between copper oxide layer 18 and copper layers 16 and 20, filaments 36 may be more uniformly created. Furthermore, spacer 26 may function as a copper migration barrier. Also, spacer 26 may reduce movement of oxygen vacancies into and/or out of copper oxide layer 18. Also, spacer 26 may reduce edge effects on the sidewall of copper oxide layer 18. For example, spacer 26 may function as a barrier to forming ruptures on the sidewall of copper oxide layer 18. In this manner, by reducing edge effects, formation of filaments 36 may be more confined within copper oxide layer 18, away from the sidewalls of copper oxide layer 18.

In an alternate embodiment, copper layer 20 may not be present such that conductive electrode layer 22 within memory cell 24 is formed directly on copper oxide layer 18. In this embodiment, note that copper layer 16 still provides the ability to absorb oxygen. Also, in another embodiment, copper layer 16, copper oxide layer 18, and copper layer 20 may all be replaced with a different conductive medium formed from another metal oxide, such as, for example, another transition metal oxide. This metal oxide layer would therefore be located between electrode layers 14 and 22. In this embodiment, spacers 26 may reduce movement of oxygen vacancies into and/or out of the metal oxide layer. Also, spacer 26 may reduce edge effects on the sidewall of the metal oxide layer. For example, spacer 26 may function as a barrier to forming ruptures on the sidewall of the metal oxide layer. In this manner, by reducing edge effects, formation of filaments within the metal oxide layer may be more confined within the metal oxide layer, away from the sidewalls of the metal oxide layer. Furthermore, spacer 26 may function as a migration barrier.

By now it should be appreciated that there has been provided a resistive RAM memory cell having a copper oxide layer grown directly on a copper layer which may allow for improved data retention and a tighter resistance distribution. Furthermore, there has also been provided a resistive RAM memory cell having a sidewall spacer which surrounds the memory stack of the memory cell and which may further improve performance of the memory cell such as by, for example, reducing movement of oxygen vacancies, reducing edge effects, and/or by functioning as a migration barrier.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, a copper layer may not be present between the copper oxide and top electrode, or, in the case of a memory stack which includes spacer 26, different transition metal oxides may be used as the conductive medium of the memory cell. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim 1ncludes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a resistive random access memory cell using a substrate, including a memory stack over the substrate, wherein the gate stack includes a first copper layer over the substrate; a copper oxide layer on the first copper layer; and a second copper layer on the copper oxide layer. Item 2 includes the resistive random access memory cell of item 1 wherein the gate stack further includes a first electrode layer between the substrate and the first copper layer. Item 3 includes the resistive random access memory cell of item 2, and further includes a second electrode layer over the second copper layer. Item 4 includes the resistive random access memory cell of item 3, wherein the first electrode layer and the second electrode layer include tantalum nitride. Item 5 includes the resistive random access memory cell of item 4, wherein the first copper layer has a first sidewall, the copper oxide layer has a second sidewall, the second copper layer has a third sidewall, and the second electrode layer has a fourth sidewall, and further includes a sidewall spacer in contact with the first sidewall, the second sidewall, the third sidewall, and the fourth sidewall. Item 6 includes the resistive random access memory cell of item 5, wherein the sidewall spacer functions a copper migration barrier. Item 7 includes the resistive random access memory cell of item 2 and further includes a transistor coupled to the first electrode layer. Item 8 includes the resistive random access memory cell of item 1, wherein the first copper layer has a first sidewall, the copper oxide layer has a second sidewall, and the second copper layer has a third sidewall, and further includes a sidewall spacer in contact with the first sidewall, the second sidewall, and the third sidewall. Item 9 includes the resistive random access memory cell of item 8, wherein the sidewall spacer functions as a barrier to movement of oxygen vacancies into and out of the metal oxide layer, a barrier to copper migration, and a barrier to forming ruptures on the second sidewall. Item 10 includes the resistive random access memory cell of item 1, and further includes an interlayer dielectric around and over the resistive random access memory.

Item 11 includes a method of making a resistive random access memory cell over a substrate, including forming a first copper layer over the substrate and a copper oxide layer over the first copper layer; and forming a second copper layer over the copper oxide layer. Item 12 includes the method of item 11, and further includes etching the first copper layer, the copper oxide layer, and second copper layer to form a memory stack having a sidewall. Item 14 includes the method of item 11, wherein the step of forming the first copper layer includes forming an initial copper layer and oxidizing a top portion of the initial copper layer to leave the first copper layer and form the copper oxide layer. Item 14 includes the method of item 13, and further includes forming a first electrode layer over the substrate before forming the first copper layer and forming a second electrode layer over the first copper layer. Item 15 includes the method of item 14, wherein the etching further includes etching the second electrode layer so as to have a sidewall aligned with the sidewall of the memory stack. Item 16 includes the method of item 15 and further includes forming a transistor, wherein the transistor is in electrical contact with the first electrode layer. Item 17 includes the method of item 16 and further includes forming a dielectric layer around and over the memory stack and forming a via in the dielectric layer and in contact with the second electrode layer. Item 18 includes the method of item 16, and further includes forming a dielectric layer around and over the memory stack and forming a via in the dielectric layer and in contact with the first electrode layer. Item 19 includes the method of item 12, and further includes forming a sidewall spacer in contact with the sidewall of the memory stack.

Item 20 includes a method of making a resistive random access memory cell, including forming a first electrode layer; forming a first copper layer on the first electrode layer; forming a copper oxide layer on the first copper layer; forming a second copper layer on the copper oxide layer; and forming a second electrode layer on the second copper layer.

What is claimed is:

1. A method of making a resistive random access memory cell over a substrate, comprising:
    forming a first electrode layer over the substrate;
    forming a first copper layer over the first electrode layer and a copper oxide layer over the first copper layer, wherein the forming the first copper layer comprises forming an initial copper layer and oxidizing a top portion of the initial copper layer to leave the first copper layer and form the copper oxide layer;
    forming a second copper layer over the copper oxide layer;
    forming a second electrode layer over the second copper layer;
    etching the first copper layer, the copper oxide layer, second copper layer, and the second electrode layer to form a memory stack having a sidewall;
    forming a sidewall spacer in contact with the sidewall of the memory stack, wherein the sidewall spacer functions as a barrier to movement of oxygen vacancies into and out of the copper oxide layer, and wherein the sidewall spacer contacts each of the first copper layer, the copper oxide layer, the second copper layer, and the second electrode layer at the sidewall of the memory stack; and
    forming a dielectric layer around and over the memory stack and the sidewall spacer.

2. The method of claim 1, wherein the sidewall spacer does not extend over a top surface of the memory stack.

3. The method of claim 1 further comprising forming a transistor, wherein the transistor is in electrical contact with the first electrode layer.

4. The method of claim 3 further comprising forming a via in the dielectric layer and in contact with the second electrode layer.

5. The method of claim 3, further comprising forming a via in the dielectric layer and in contact with the first electrode layer.

6. The method of claim 1, wherein the sidewall spacer has a composition comprising silicon, carbon, and nitrogen.

7. A method of making a resistive random access memory cell, comprising:
    forming a first electrode layer;
    forming a first copper layer on the first electrode layer;
    oxidixing a to portion of the first copper layer to form a copper oxide layer on the first copper layer;
    forming a second copper layer on the copper oxide layer;
    forming a second electrode layer on the second copper layer;
    etching the first copper layer, the copper oxide layer, the second copper layer, and the second electrode layer to form a memory stack having a sidewall;
    forming a sidewall spacer in contact with the sidewall of the memory stack, wherein the sidewall spacer has a composition comprising silicon, carbon, and nitrogen, and wherein the sidewall spacer functions as a barrier to movement of oxygen vacancies into and out of the copper oxide layer; and
    forming a dielectric layer around and over the memory stack and the sidewall spacer.

\* \* \* \* \*